United States Patent
Lai et al.

(10) Patent No.: US 7,569,111 B2
(45) Date of Patent: Aug. 4, 2009

(54) METHOD OF CLEANING DEPOSITION CHAMBER

(75) Inventors: Chien-Hsin Lai, Kao-Hsiung Hsien (TW); Chun-Yi Wang, Chang-Hua Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 535 days.

(21) Appl. No.: 11/379,227

(22) Filed: Apr. 19, 2006

(65) Prior Publication Data
US 2007/0246062 A1 Oct. 25, 2007

(51) Int. Cl.
  *B08B 3/12* (2006.01)
  *B08B 6/00* (2006.01)
(52) U.S. Cl. .............. 134/1; 134/1.1; 134/1.2; 134/1.3
(58) Field of Classification Search .............. None
  See application file for complete search history.

(56) References Cited

U.S. PATENT DOCUMENTS

| 5,935,340 | A | 8/1999 | Xia |
| 6,125,859 | A | 10/2000 | Kao |
| 6,584,987 | B1 | 7/2003 | Cheng et al. |
| 2003/0029475 | A1 | 2/2003 | Hua |
| 2003/0170402 | A1 | 9/2003 | Arai |
| 2004/0000321 | A1* | 1/2004 | Cui et al. ............... 134/1.2 |
| 2005/0108892 | A1* | 5/2005 | Wu et al. ............... 34/444 |
| 2006/0032833 | A1* | 2/2006 | Kawaguchi et al. ...... 216/37 |
| 2006/0040066 | A1 | 2/2006 | Tsutae |
| 2006/0093756 | A1* | 5/2006 | Rajagopalan et al. ..... 427/569 |

FOREIGN PATENT DOCUMENTS

| JP | 3-44469 | 2/1991 |
| JP | 2000-265275 | 9/2000 |
| TW | 481825 | 4/2002 |
| TW | 571364 | 1/2004 |

OTHER PUBLICATIONS

Fluorinated gases for semiconductor manufacture: process advances in chemical vapor deposition chamber cleaning, Charles C. Allgood, Journal of Fluorine Chemistry 122 (2003) 105-112, Jul. 1, 2003.

* cited by examiner

*Primary Examiner*—Duy-Vu N Deo
(74) *Attorney, Agent, or Firm*—Winston Hsu

(57) ABSTRACT

A process for cleaning a deposition chamber. The process includes feeding a fluorine-containing gas into the deposition chamber; maintaining the fluorine-containing gas in the deposition chamber at a first pressure; providing RF power to ignite plasma of the fluorine-containing gas within the deposition chamber; keeping the deposition chamber at a first temperature for a time period with the presence of the plasma; turning off the RF power to cease the plasma; and feeding a remote plasma containing free fluorine from a remote plasma source into the deposition chamber, without evacuating the deposition chamber, at the first temperature to clean interior surfaces of the deposition chamber.

14 Claims, 4 Drawing Sheets

METHOD OF CLEANING DEPOSITION CHAMBER

BACKGROUND OF THE INVENTION

1. Field of the Invention

The present invention relates in general to the manufacture of semiconductor devices and, more particularly, to a method for efficiently and uniformly cleaning a chemical vapor deposition (CVD) chamber used in the manufacture of such devices.

2. Description of the Prior Art

Plasma reactors such as chemical vapor deposition (CVD) tools employed in deposition processing of semiconductor wafers tend to accumulate contaminants on the interior chamber surfaces. Such contamination occurs because the same material deposited on the substrate or wafer is also deposited on the interior chamber surfaces.

For instance, a high-density plasma chemical vapor deposition (HDPCVD) tool is commonly employed to deposit material layers such as silicon dioxide on a substrate. It is well known that over a period of use, the material layers form as deposits on the walls of a deposition chamber. The buildup of these material layer deposits is undesirable because the deposits can flake off from the interior surfaces of the deposition chamber and introduce defects into the substrate and overlying layers and decrease the uniformity of layers being deposited on the substrate and the overall quality of the device.

As the yield of functional devices produced from the chamber continues to decrease, it eventually becomes necessary to stop semiconductor device fabrication and replace the dome of the deposition chamber, thereby increasing the overall costs of semiconductor device fabrication.

To reduce the build-up of material layer deposits, the deposition chamber is periodically cleaned in situ, usually using a fluorine-containing cleaning gas, such as fluorine, nitrogen tri-fluoride ($NF_3$) or hexafluoroethane ($C_2F_6$). Periodic in situ cleaning is typically done in-between chemical deposition procedures being performed on one or more batches of wafers. It is desired to provide a balance between efficient chamber cleaning in a minimum period and using a minimum amount of cleaning gas.

U.S. Pat. No. 6,584,987 filed Mar. 16, 2001 by Cheng et al. teaches a method for improved cleaning in HDPCVD process with reduced $NF_3$ usage. The method disclosed in U.S. Pat. No. 6,584,987 includes the steps of providing argon/perfluorinated hydrocarbon plasma in a chamber to be cleaned; flowing oxygen gas into the chamber; maintaining the plasma in the chamber to elevate the temperature of the chamber; baking the chamber containing the plasma for a period of time; turning off the power to cease the plasma; evacuating the chamber; and flowing cleaning gas into the chamber to start normal cleaning procedure.

One drawback of this method is that additional gases such as oxygen and perfluorinated hydrocarbon are required. After baking the chamber and prior to the normal $NF_3$ cleaning procedure, the gas mixture must be pumped out of the chamber. It is disadvantageous that the use of such cleaning gases in a baking step requires additional processing time thereby decreasing wafer throughput.

In light of the above, there is a need in this industry to provide an efficient in situ cleaning process that allows the production of semiconductor devices with low numbers of defects and thereby extending the time between dome changes of the deposition chamber. Further, it is desired to provide a uniform clean to the interior surfaces of the dome of the deposition chamber.

SUMMARY OF THE INVENTION

To address the above-discussed deficiencies of the prior art, the present invention provides a process for cleaning a deposition chamber. The process includes feeding a fluorine-containing gas into the deposition chamber; maintaining the fluorine-containing gas in the deposition chamber at a first pressure; providing RF power to ignite plasma of the fluorine-containing gas within the deposition chamber; keeping the deposition chamber at a first temperature for a time period with the presence of the plasma; turning off the RF power to cease the plasma; and feeding a remote plasma containing free fluorine from a remote plasma source into the deposition chamber, without evacuating the deposition chamber, at the first temperature to clean interior surfaces of the deposition chamber.

In another embodiment, the present invention provides a method for cleaning a chemical vapor deposition (CVD) tool, wherein the CVD tool comprises a base portion comprising a pedestal and a guard ring, a dome mounted on the base portion to form a deposition chamber, a plurality of first conduits distributed along lower perimeter of the deposition chamber for injecting gas from a side direction, and a plurality of second conduits directed to ceiling of the dome. The method includes feeding a fluorine-containing gas through the first conduits and second conduits into the deposition chamber; maintaining the fluorine-containing gas in the deposition chamber at a first pressure; providing RF power to ignite plasma of the fluorine-containing gas within the deposition chamber; keeping the deposition chamber at a first temperature for a time period with the presence of the plasma; turning off the RF power to cease the plasma; and feeding a remote plasma containing free fluorine from a remote plasma source into the deposition chamber through at least the first conduits, without evacuating the deposition chamber, at the first temperature to clean interior surfaces of the deposition chamber.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

As previously described, during chemical vapor deposition (CVD) processing, deposition gas molecules are deposited on the surface of a substrate. Some of these molecules also come in contact with areas of the chamber, such as the aluminum walls, resulting in the unwanted deposition of material and residues. When the build-up of surface deposits on the inside of the processing chamber becomes thick, flakes or particles of the deposited material can break off from the surface of the chamber onto the substrate being processed, potentially causing a defect. Surface deposits also adversely affect other processing conditions such as deposition uniformity, deposition rate, film strength and the like.

In order to remove deposited material and residues from the chamber walls in a plasma process, etching gases, such as fluorine or $NF_3$ are typically employed. The plasma enhanced etching gases can be used periodically after a number of wafers has been processed or after every wafer. The etching gases react with the deposited material so as to remove it from the surfaces of the processing chamber.

However, it is discovered by the inventors that the prior art cleaning processes often cannot uniformly remove all the residues from the chamber walls. Residual deposits such as silicon dioxide ($SiO_2$) are often left at the lower inner wall of the dome. To completely remove the deposits, the upper inner wall of the dome is often over-cleaned, causing $AlF_3$ dark rings. The presence of $AlF_3$ on the dome can cause significant particulate contamination during subsequent processing in the CVD chamber. The dark rings are often observed on the interior surfaces of the dome after implementing several times of prior art plasma-cleaning steps.

Further, the etchant gases can increase the amount of particles into the processing chamber from precipitates derived from the etching gases and the like. Examples of precipitates include aluminum oxide, aluminum fluoride, aluminum oxyfluoride, and others. The precipitates increase the particle count in the processing chamber, which is clearly an undesirable result.

The present invention provides an improved CVD chamber cleaning system and cleaning method that is capable of solving the above-described problems. More specifically, the present invention provides a method to achieve complete removal of deposited $SiO_2$ from the inner wall of the dome without inducing the aforesaid dark ring phenomenon.

Figure 1:
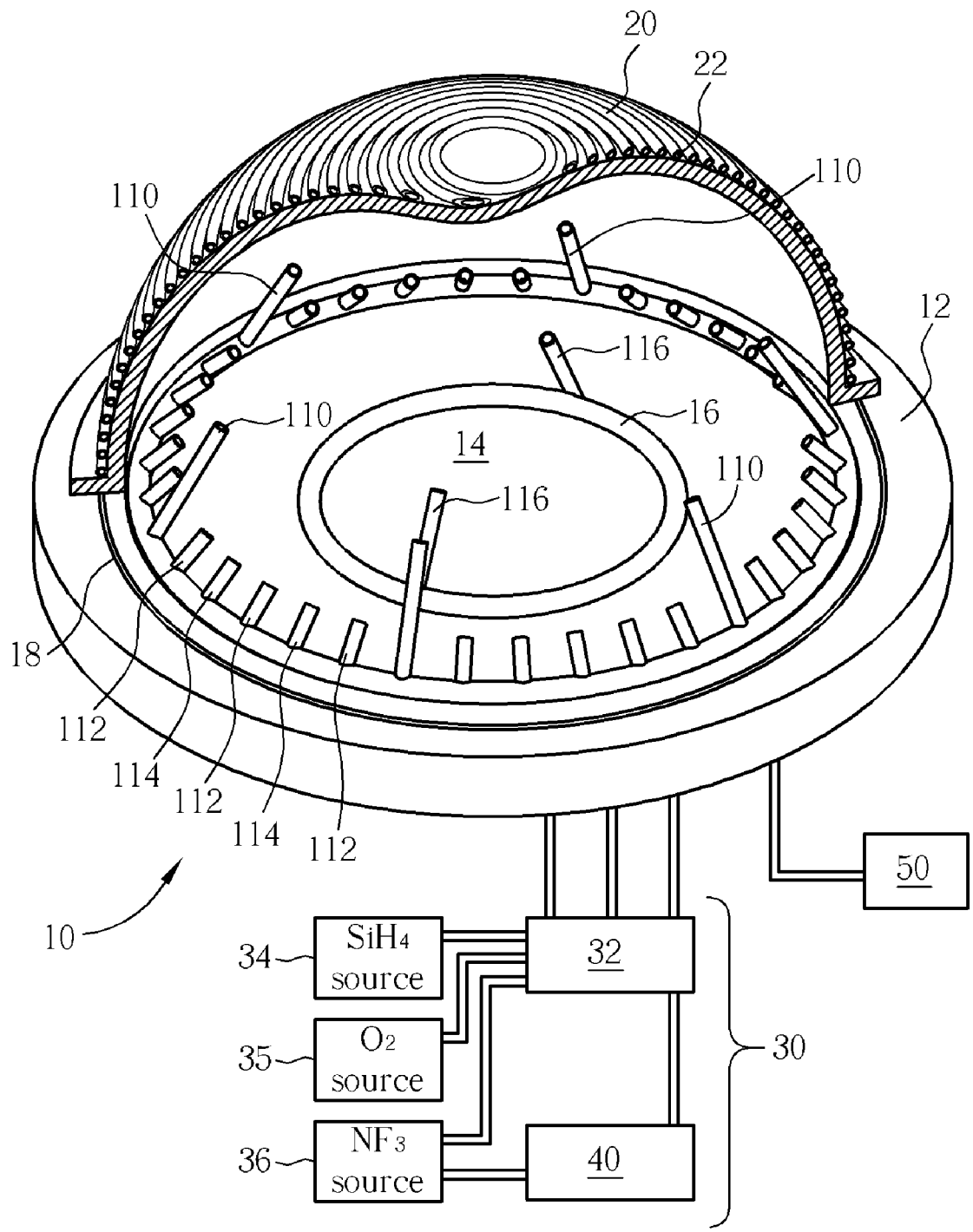
FIG. 1 is a perspective schematic diagram illustrating an exemplary deposition chamber of a single-chambered high-density plasma chemical vapor deposition (HDPCVD) tool in accordance with one preferred embodiment of this invention.
Figure 2:
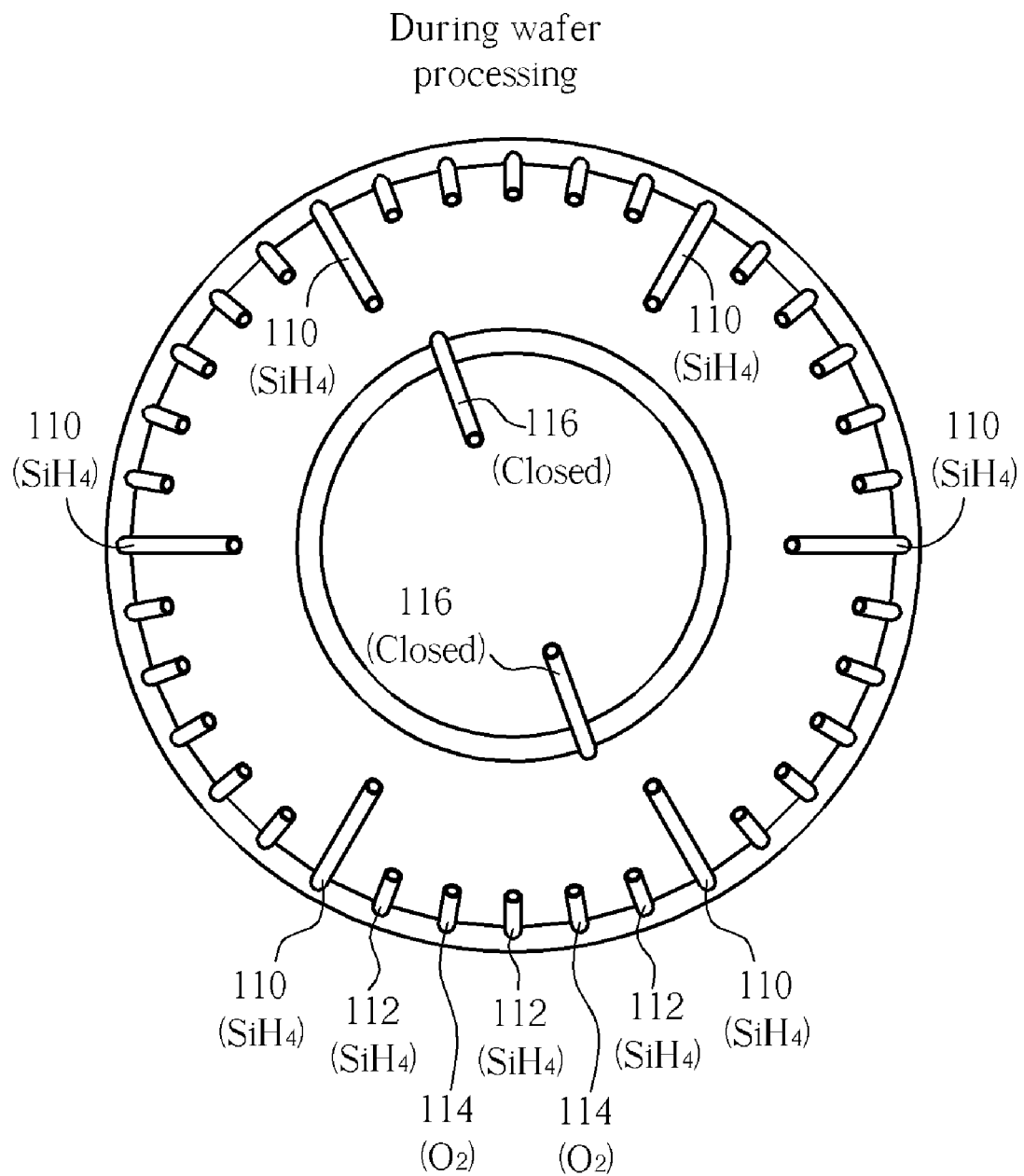
FIG. 2 is a top view of the configuration of the gas injection conduits of the deposition chamber in FIG. 1 according to this invention.

Please refer to FIGS. 1 and 2. FIG. 1 is a perspective schematic diagram illustrating an exemplary deposition chamber of a single-wafer high-density plasma chemical vapor deposition (HDPCVD) tool in accordance with one preferred embodiment of this invention. FIG. 2 is a top view of the configuration of the gas injection conduits of the deposition chamber depicted in FIG. 1 according to this invention.

The HDPCVD tool 10 generally comprises a base portion 12 and a semi-spherical lid (hereinafter referring to as "dome") 20. The dome 20 may be made of quartz or ceramic material including, but not limited to, $Al_2O_3$. Induction coils 22 are wound at the outer wall of the dome 20 in order to provide radio-frequency (RF) power for igniting and maintain plasma within the deposition chamber. Cooling water may flow through the induction coil 22.

As previously mentioned, as the interior surface of the dome 20 is over-etched, the cleaning plasma gas such as nitrogen tri-fluoride ($NF_3$) plasma gas reacts with the exposed inner walls of the dome 20, thereby forming unwanted substance such as $AlF_3$ and produces the aforesaid dark ring phenomenon.

The base portion 12 comprises a pedestal 14 for supporting a wafer or a semiconductor substrate to be processed and a guard ring 16 encircling the pedestal 14. The pedestal 14 may be made of ceramic or anodized aluminum, but not limited thereto. An O-ring 18 is provided between the base portion 12 and the dome 20 for hermetic sealing when the dome is placed on the base portion 12 to form a reactive chamber during a CVD process.

A gas supply system 30 is provided and is connected to the base portion 12 for conveying reactant gases such as silane ($SiH_4$) or oxygen ($O_2$) gas and cleaning gases such as ($NF_3$) from their gas sources 34, 35 and 36 into the deposition chamber through the gas injection conduits 110, 112, 114 and 116, respectively. The gas sources are connected to a gas manifold and control unit 32 through which process gases or cleaning gas are distributed to the respective gas injection conduits. It is noted that the control device such as control valves or flow control device such as mass flow controller (MFC) are not shown for simplicity.

A remote plasma source (RPS) unit 40 is connected to the gas manifold and control unit 32 for providing free fluorine (fluorine in radical form) to the deposition chamber when it is under a cleaning mode. According to the preferred embodiment, the RPS unit 40 ionizes $NF_3$ gas supplied by the $NF_3$ gas source 36 in an external chamber to generate the free fluorine. The RPS unit 40 may be, for example, any known devices for producing plasma, including but not limited to a microwave discharge plasma source, an inductively coupled plasma (ICP) source, a silent barrier discharge (SBD) plasma source or a capacitively coupled plasma source.

A vacuum pump 50 is coupled to the deposition chamber in order to control chamber pressure and to evacuate the chamber.

During wafer processing, for example, deposition of HDPCVD silicon dioxide film, a semiconductor wafer (not shown) is held on top of the pedestal 14. $SiH_4$ from gas source 34 is introduced into the deposition chamber simultaneously through the gas injection conduits 110 and 112. Oxygen gas from gas source 35 is also introduced into the deposition chamber through the gas injection conduit 114. As specifically indicated in FIG. 1 and FIG. 2, gas injection conduits 112 and 114, for example, every five conduits, are arranged between two gas injection conduits 110, which are relatively longer than the gas injection conduits 112 and 114.

The oblique gas injection conduits 112 and 114 (hereinafter also referring to as "side conduits"), which are evenly distributed along the perimeter of the deposition chamber can supply gas from the side direction to the central portion of the deposition chamber, while the longer gas injection conduits 110 (hereinafter also referring to as "ceiling conduits") convey gas to the ceiling of the dome 20.

RF power is applied to the pedestal 14 to control plasma ion energy near the wafer surface. During wafer processing, the HDPCVD silicon dioxide film deposits on the wafer and also on the interior surfaces of the deposition chamber. The HDPCVD silicon dioxide film may also deposit on the nozzles of the gas injection conduits 112 and 114, which is especially difficult to remove by utilizing conventional cleaning procedures.

After the deposition of the HDPCVD silicon dioxide film is accomplished, the semiconductor wafer (not shown) is removed from the pedestal 14. A chamber cleaning process is then carried out, which is performed periodically typically after processing a batch of wafers or at least one wafer.

According to this invention, a two-stage cleaning method is provided. At the first stage, plasma gas clean (which is also referred to as "bright mode") is employed, while at the second stage, remote plasma (which is also referred to as "dark mode") is used to clean the remaining residues.

Figure 3:
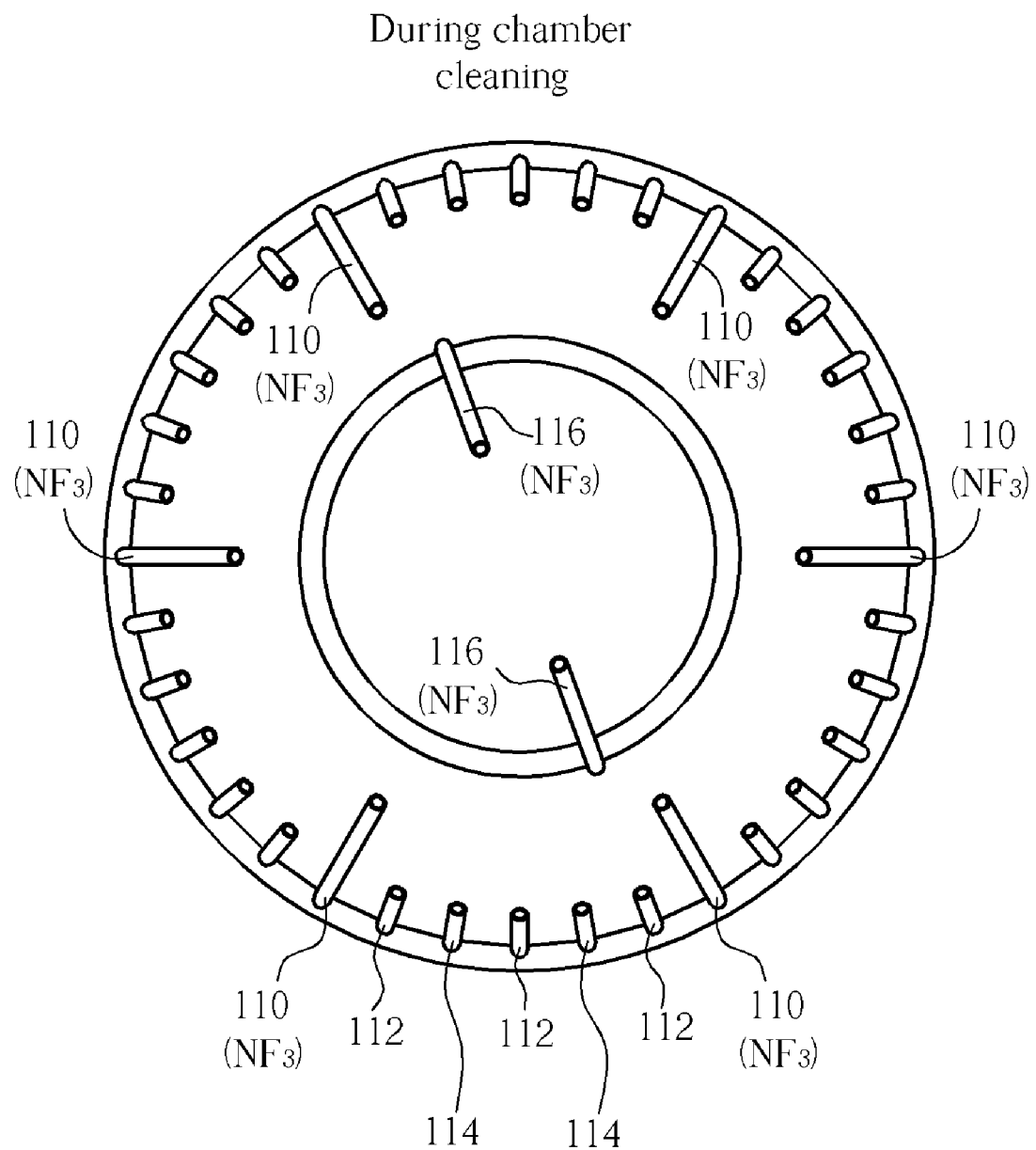
FIG. 3 is a top view of the configuration of the gas injection conduits of the deposition chamber during chamber cleaning according to this invention.

According to one preferred embodiment, first, the deposition chamber is evacuated by the vacuum pump 50. A flow of fluorine-containing gas, preferably $NF_3$, supplied by gas source 36, is fed into the deposition chamber through the manifold and control unit 32 and only through the ceiling conduits 110 and gas injection conduits 116 (hereinafter also referring to as "cleaning conduits"), as indicated in FIG. 3, and is maintained at a suitable pressure. The suitable pressure can be controlled by the vacuum pump 50.

According to another preferred embodiment, after evacuating the deposition chamber, a flow of fluorine-containing gas, preferably $NF_3$, supplied by gas source 36, is fed into the deposition chamber through the manifold and control unit 32 and through the ceiling conduits 110, cleaning conduits 116 and side conduits 112 or 114 in order to provide a more uniform radical distribution of the fluorine ions and improve clean uniformity, thereby reducing over-etch of the top of the dome 20 and under-etch of the lower sidewall of the dome.

RF power is then turned on to ignite plasma. $NF_3$ gas in the presence of a high-density plasma discharge dissociates to produce reactive fluorine species such as fluorine radicals and nitrogen fluoride radicals. The highly reactive species in the plasma gas bombards the sidewalls of the dome and reacts with the deposits thereon, thereby in situ cleaning the interior surfaces of the deposition chamber. Preferably, the temperature of the chamber is greater than 100° C., more preferably greater than 200° C., during the plasma gas cleaning.

According to the preferred embodiment of this invention, the bright mode is implemented at a relatively high pressure of, for example, about 3-15 Torr, preferably 5-10 Torr. Under the aforesaid high pressure, the cleaning rate is high and thus provides efficient cleaning with respect to the top of the dome, the pedestal 14 and the guard ring 16. However, the bright mode may be carried out at a relative low pressure of, for example, about 0.1-3 Torr, preferably less than 2 Torr. Under the aforesaid low pressure, the flow rate of the cleaning gas is relatively lower and thus provides adequate cleaning with respect to the lower sidewall of the dome and the side conduits 112 and 114.

In another case, the bright mode may be carried out in an alternating high/low-pressure fashion. That is, the plasma gas clean can be implemented initially at a relatively higher pressure, and then changed to a lower pressure, and vice versa.

Figure 4:
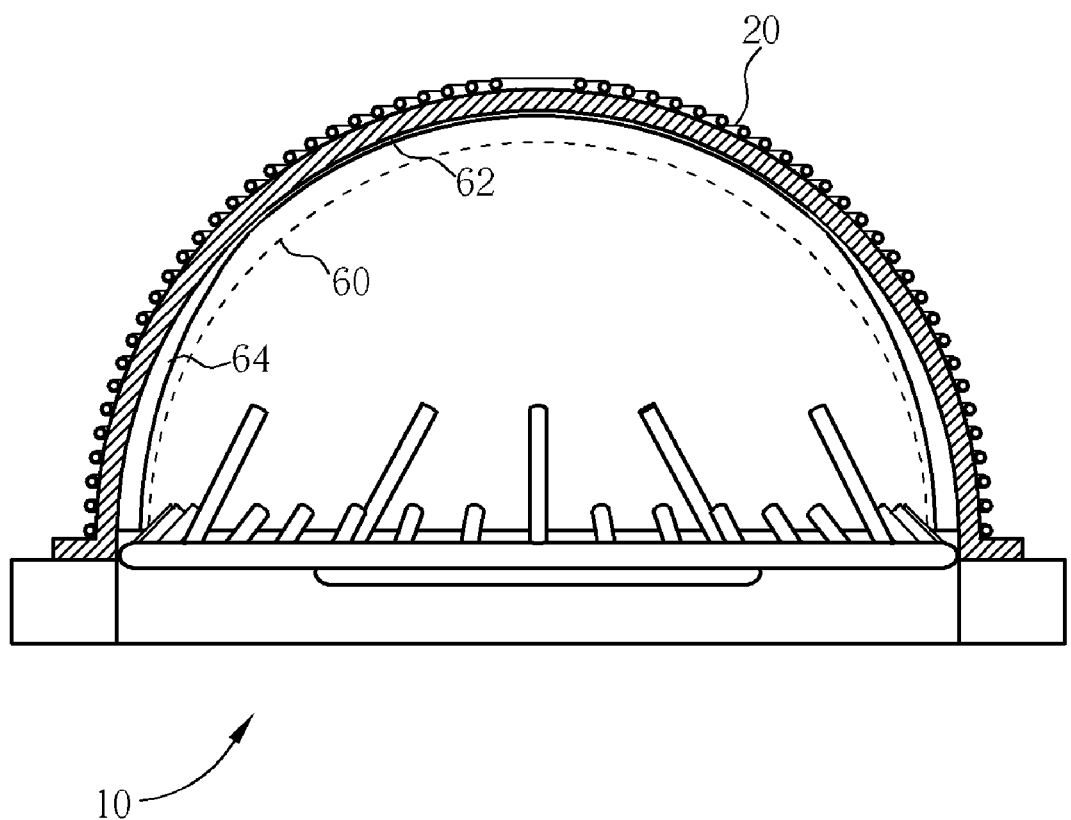
FIG. 4 is a schematic, cross-sectional diagram depicting an exemplary profile of the sidewall of the dome after completing the first stage clean.

The first stage (plasma gas cleaning) lasts for about 10-300 seconds, for example, depending upon the thickness of the deposits on the interior surfaces of the deposition chamber. FIG. 4 is a schematic, cross-sectional diagram depicting an exemplary profile of the sidewall of the dome 20 after completing the first stage clean. In FIG. 4, the original thickness of the $SiO_2$ is indicated by numeral 60 (dash line). The remaining $SiO_2$ film 62 at the top of the dome 20 is typically thinner than the remaining $SiO_2$ film 64 at the lower sidewall of the dome 20. Most importantly, before the interior surface of the dome 20 is exposed, the plasma gas cleaning is terminated. The RF power is turned off and the $NF_3$ gas supply from the gas source 36 is cut off to cease the first stage clean.

Subsequently, the second stage (dark mode) starts. Without evacuating the deposition chamber or breaking the vacuum of the chamber, a flow of remote plasma containing fluorine radicals supplied by the RPS unit 40 is immediately introduced into the deposition chamber through the manifold and control unit 32. The remote plasma can be injected into the deposition chamber through the side conduits 112 or 114, ceiling conduits 110 or cleaning conduits 116, preferably through the side conduits 112 or 114.

The remote plasma generated by the RPS unit 40 etches the remaining $SiO_2$ film on the interior surfaces of the deposition chamber that is not removed at the first stage in a milder but more uniform fashion (no ion bombardment in the chamber). Since the dome 20 has been baked to about 100-200° C. at the first stage, the remote plasma can efficiently remove the remaining $SiO_2$ film on the interior surfaces of the deposition chamber without significantly reacting with the exposed interior surface of the ceramic dome 20.

Likewise, the dark mode can be implemented at a relatively high pressure of, for example, about 3-15 Torr, preferably 5-10 Torr. Under the aforesaid high pressure, the cleaning rate is high and thus provides higher cleaning rate to the top of the dome, the pedestal 14 and the guard ring 16. The dark mode can be carried out at a relative low pressure of, for example, about 0.1-3 Torr, preferably less than 2 Torr, in order to uniformly clean the lower sidewall of the dome and the side conduits 112 and 114. An alternating high/low-pressure may be employed in the dark mode. That is, the dark mode can be implemented initially at a relatively higher pressure, and then changed to a lower pressure, and vice versa.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for cleaning a deposition chamber, comprising:
   feeding a fluorine-containing gas into the deposition chamber;
   maintaining the fluorine-containing gas in the deposition chamber at a first pressure;
   providing RF power to ignite plasma of the fluorine-containing gas within the deposition chamber;
   keeping the deposition chamber at a first temperature for a time period with the presence of the plasma;
   turning off the RF power to cease the plasma; and
   thereafter, feeding a remote plasma containing free fluorine from a remote plasma source into the deposition chamber at the first temperature to clean interior surfaces of the deposition chamber.

2. The method of claim 1 wherein the fluorine-containing gas comprises nitrogen tri-fluoride ($NF_3$).

3. The method of claim 1 wherein the first pressure ranges between 3-15 Torr.

4. The method of claim 1 wherein the first pressure ranges between 0.1-15 Torr.

5. The method of claim 1 wherein after maintaining the fluorine-containing gas in the deposition chamber at the first pressure, the method further comprises the following step:
   altering the deposition chamber to a second pressure that is not equal to the first pressure.

6. The method of claim 1 wherein the first temperature is greater than 100° C.

7. A method for cleaning a chemical vapor deposition (CVD) tool, wherein the CVD tool comprises a base portion comprising a pedestal and a guard ring, a dome which is covered by residual deposits mounted on the base portion to form a deposition chamber, a plurality of first conduits distributed along lower perimeter of the deposition chamber for injecting gas from a side direction, and a plurality of second conduits directed to ceiling of the dome, the method comprising:
   feeding a fluorine-containing gas through the first conduits and second conduits into the deposition chamber;

maintaining the fluorine-containing gas in the deposition chamber at a first pressure;
providing RF power to ignite plasma of the fluorine-containing gas within the deposition chamber;
keeping the deposition chamber at a first temperature for a time period with the presence of the plasma;
turning off the RF power to cease the plasma; and
thereafter, feeding a remote plasma containing free fluorine from a remote plasma source into the deposition chamber through at least the first conduits, without evacuating the deposition chamber, at the first temperature to clean interior surfaces of the deposition chamber.

8. The method of claim 7 wherein the fluorine-containing gas comprises nitrogen tri-fluoride ($NF_3$).

9. The method of claim 7 wherein the first pressure ranges between 3-15 Torr.

10. The method of claim 7 wherein the first pressure ranges between 0.1-15 Torr.

11. The method of claim 7 wherein after maintaining the fluorine-containing gas in the deposition chamber at the first pressure, the method further comprises the following step:
altering the deposition chamber to a second pressure that is not equal to the first pressure.

12. The method of claim 7 wherein the first temperature is greater than 100° C.

13. The method of claim 7 wherein the RF power is turned off before inner surface of the dome is exposed through the residual deposits.

14. The method of claim 7 wherein the dome is made of quartz or ceramic material.

* * * * *